(12) United States Patent
Isoda et al.

(10) Patent No.: US 12,329,038 B2
(45) Date of Patent: Jun. 10, 2025

(54) MAGNETORESISTANCE MEMORY DEVICE

(71) Applicant: Kioxia Corporation, Tokyo (JP)

(72) Inventors: Taiga Isoda, Seoul (KR); Eiji Kitagawa, Seoul (KR); Young Min Eeh, Seongnam-si (KR); Tadaaki Oikawa, Seoul (KR); Kazuya Sawada, Seoul (KR)

(73) Assignee: Kioxia Corporation, Tokyo (JP)

( * ) Notice: Subject to any disclaimer, the term of this patent is extended or adjusted under 35 U.S.C. 154(b) by 656 days.

(21) Appl. No.: 17/549,248

(22) Filed: Dec. 13, 2021

(65) Prior Publication Data

US 2023/0072970 A1    Mar. 9, 2023

(30) Foreign Application Priority Data

Sep. 9, 2021    (JP) ................. 2021-147086

(51) Int. Cl.
| | |
|---|---|
| *H10N 50/10* | (2023.01) |
| *H10B 61/00* | (2023.01) |
| *H10N 50/80* | (2023.01) |
| *H10N 50/85* | (2023.01) |

(52) U.S. Cl.
CPC ............ *H10N 50/10* (2023.02); *H10B 61/00* (2023.02); *H10N 50/80* (2023.02); *H10N 50/85* (2023.02)

(58) Field of Classification Search
CPC ........ H10N 50/10; H10N 50/80; H10N 50/85; H10B 61/00; H10B 61/10; H10F 10/3254; H10F 10/3272
See application file for complete search history.

(56) References Cited

U.S. PATENT DOCUMENTS

| | | |
|---|---|---|
| 6,567,246 B1 | 5/2003 | Sakakima et al. |
| 8,995,181 B2 | 3/2015 | Watanabe et al. |
| 9,130,143 B2 | 9/2015 | Nagase et al. |
| 9,142,756 B2 | 9/2015 | Nagamine et al. |

(Continued)

FOREIGN PATENT DOCUMENTS

| | | |
|---|---|---|
| JP | 2001352112 A | 12/2001 |
| JP | 2003031867 A | 1/2003 |

(Continued)

OTHER PUBLICATIONS

Ikawa, "Chapter 1 Basics of Electroplating", Understand by example Plating defects and countermeasures, pp. 2-7, Feb. 2018.

(Continued)

*Primary Examiner* — Fernando L Toledo
*Assistant Examiner* — Marshall Mu-Nuo Hatfield
(74) *Attorney, Agent, or Firm* — Holtz, Holtz & Volek PC (57) ABSTRACT

A magnetoresistance memory device includes first, second, third and fourth ferromagnetic layers; a first and second ferromagnetic oxide layers; a metal layer; an insulating layer. The second ferromagnetic layer includes one of iron and cobalt included in the first ferromagnetic oxide layer and one element of a first element group. The second ferromagnetic oxide layer includes an oxide of an alloy of the one of iron and cobalt included in the second ferromagnetic oxide layer with a first element, which has a standard electrode potential lower than that of iron or cobalt and that of the one element of the first element group included in the second ferromagnetic layer.

4 Claims, 7 Drawing Sheets

(56) References Cited

U.S. PATENT DOCUMENTS

| | | |
|---|---|---|
| 9,184,374 B2 | 11/2015 | Sawada et al. |
| 9,209,386 B2 | 12/2015 | Nagamine et al. |
| 9,252,357 B2 | 2/2016 | Watanabe et al. |
| 9,269,890 B2 | 2/2016 | Nakayama et al. |
| 9,293,695 B2 | 3/2016 | Ueda et al. |
| 9,461,240 B2 | 10/2016 | Sawada et al. |
| 9,466,350 B2 | 10/2016 | Murayama et al. |
| 9,608,199 B1 | 3/2017 | Kitagawa |
| 9,620,561 B2 | 4/2017 | Nagase et al. |
| 9,640,584 B2 | 5/2017 | Nagamine et al. |
| 9,647,203 B2 | 5/2017 | Kitagawa et al. |
| 9,705,076 B2 | 7/2017 | Nagamine et al. |
| 9,741,928 B2 | 8/2017 | Ueda et al. |
| 9,947,862 B2 | 4/2018 | Watanabe et al. |
| 9,991,313 B2 | 6/2018 | Watanabe et al. |
| 10,026,888 B2 | 7/2018 | Ochiai et al. |
| 10,026,891 B2 | 7/2018 | Nagase et al. |
| 10,090,459 B2 | 10/2018 | Watanabe et al. |
| 10,103,318 B2 | 10/2018 | Watanabe et al. |
| 10,170,519 B2 | 1/2019 | Eeh et al. |
| 10,199,568 B2 | 2/2019 | Nagamine et al. |
| 10,211,256 B2 | 2/2019 | Kitagawa |
| 10,263,178 B2 | 4/2019 | Sawada et al. |
| 10,325,640 B2 | 6/2019 | Kishi et al. |
| 10,388,343 B2 | 8/2019 | Oikawa et al. |
| 10,468,170 B2 | 11/2019 | Eeh et al. |
| 10,510,950 B2 | 12/2019 | Watanabe et al. |
| 10,840,434 B2 | 11/2020 | Kitagawa et al. |
| 10,873,021 B2 | 12/2020 | Eeh et al. |
| 10,910,032 B2 | 2/2021 | Kishi et al. |
| 11,127,445 B2 | 9/2021 | Eeh et al. |
| 11,201,189 B2 | 12/2021 | Eeh et al. |
| 2003/0016475 A1 | 1/2003 | Hoshiya et al. |
| 2013/0069185 A1* | 3/2013 | Saida ............... H01F 10/3236 257/422 |
| 2013/0077396 A1* | 3/2013 | Kondo ............... G11C 11/1673 365/173 |
| 2013/0163314 A1* | 6/2013 | Yamane ............... H10N 50/10 365/158 |
| 2014/0175582 A1* | 6/2014 | Apalkov ............... G11C 11/161 257/425 |
| 2014/0284534 A1 | 9/2014 | Nagase et al. |
| 2014/0284733 A1 | 9/2014 | Watanabe et al. |
| 2015/0068887 A1 | 3/2015 | Nagamine et al. |
| 2015/0069544 A1 | 3/2015 | Nagamine et al. |
| 2015/0069554 A1 | 3/2015 | Nakayama et al. |
| 2015/0259788 A1 | 9/2015 | Nagamine et al. |
| 2016/0099408 A1 | 4/2016 | Nagamine et al. |
| 2016/0130693 A1 | 5/2016 | Sawada et al. |
| 2016/0260773 A1 | 9/2016 | Kitagawa et al. |
| 2016/0268501 A1 | 9/2016 | Kitagawa |
| 2017/0263678 A1 | 9/2017 | Kitagawa |
| 2017/0263679 A1 | 9/2017 | Ozeki et al. |
| 2017/0263680 A1 | 9/2017 | Yoshino et al. |
| 2018/0076262 A1 | 3/2018 | Eeh et al. |
| 2018/0205006 A1 | 7/2018 | Watanabe et al. |
| 2018/0269043 A1 | 9/2018 | Ueda et al. |
| 2018/0277745 A1 | 9/2018 | Oikawa et al. |
| 2018/0309048 A1 | 10/2018 | Ochiai et al. |
| 2019/0080833 A1* | 3/2019 | Eeh ............... H01F 10/3286 |
| 2020/0075671 A1 | 3/2020 | Ozeki et al. |
| 2020/0294567 A1 | 9/2020 | Oikawa et al. |
| 2020/0302987 A1 | 9/2020 | Sawada et al. |
| 2020/0303632 A1 | 9/2020 | Watanabe et al. |
| 2021/0074908 A1 | 3/2021 | Oikawa et al. |
| 2021/0074911 A1 | 3/2021 | Isoda et al. |
| 2021/0083170 A1 | 3/2021 | Sawada et al. |
| 2021/0242395 A1* | 8/2021 | Wang ............... H10N 50/85 |
| 2021/0246543 A1* | 8/2021 | Shimizu ............... G11B 5/7334 |
| 2021/0287728 A1 | 9/2021 | Isoda et al. |
| 2021/0287755 A1 | 9/2021 | Aikawa et al. |
| 2021/0288240 A1 | 9/2021 | Sawada et al. |

FOREIGN PATENT DOCUMENTS

| | | |
|---|---|---|
| JP | 3601690 B2 | 10/2004 |
| JP | 2019054054 A | 4/2019 |

OTHER PUBLICATIONS

Sriplai, et al., "Magnetic behavior of novel alloyed L 10-phase Co1-xFexPt nanoparticles", Journal of Alloys and Compounds, vol. 739, pp. 19-29, 2018.

U.S. Appl. No. 17/199,593, First Named Inventor: Kenichi Yoshino; Title: "Magnetic Memory Device and Method for Manufacturing the Same"; filed Mar. 12, 2021.

U.S. Appl. No. 17/389,399, First Named Inventor: Taiga Isoda; Title: "Magnetoresistance Memory Device"; filed Jul. 30, 2021.

U.S. Appl. No. 17/471,327, First Named Inventor: Takao Ochiai; Title: "Magnetoresistance Memory Device and Method of Manufacturing Magnetoresistance Memory Device"; filed Sep. 10, 2021.

U.S. Appl. No. 17/471,340, First Named Inventor: Kazuya Sawada; Title: "Magnetic Memory Device"; filed Sep. 10, 2021.

U.S. Appl. No. 17/472,056, First Named Inventor: Tadaaki Oikawa; Title: "Magnetic Memory Device"; filed Sep. 10, 2021.

U.S. Appl. No. 17/472,131, First Named Inventor: Eiji Kitagawa; Title: "Magnetic Memory Device"; filed Sep. 10, 2021.

U.S. Appl. No. 17/472,472, First Named Inventor: Tadaaki Oikawa; Title: "Magnetic Memory Device"; filed Sep. 10, 2021.

U.S. Appl. No. 17/546,455, First Named Inventor: Tadaaki Oikawa; Title: "Magnetic Memory Device"; filed Dec. 9, 2021.

U.S. Appl. No. 17/550,194, First Named Inventor: Taichi Igarashi; Title: "Memory Device"; filed Dec. 14, 2021.

* cited by examiner

MAGNETORESISTANCE MEMORY DEVICE

CROSS-REFERENCE TO RELATED APPLICATIONS

This application is based upon and claims the benefit of priority from Japanese Patent Application No. 2021-147086, filed Sep. 9, 2021, the entire contents of which are incorporated herein by reference.

FIELD

Embodiments described herein relate generally to a magnetoresistance memory device.

BACKGROUND

A magnetoresistance memory device is known as a type of memory device. A magnetoresistance memory device stores data using an element exhibiting a magnetoresistance effect. To improve the characteristics of the magnetoresistance memory device, it is desired that memory cells have a high magnetic property.

DETAILED DESCRIPTION

In general, according to one embodiment, a magnetoresistance memory device includes: a first ferromagnetic layer; a first ferromagnetic oxide layer including one of iron or cobalt; a metal layer between the first ferromagnetic layer and the first ferromagnetic oxide layer; a second ferromagnetic layer on a surface of the first ferromagnetic oxide layer that is opposite to the metal layer; a second ferromagnetic oxide layer on a surface of the second ferromagnetic layer that is opposite to the first ferromagnetic oxide layer; a third ferromagnetic layer on the second ferromagnetic oxide layer; an insulating layer on the third ferromagnetic layer; and a fourth ferromagnetic layer on the insulating layer.

The metal layer antiferromagnetically couples the first ferromagnetic layer and the first ferromagnetic oxide layer. The second ferromagnetic layer includes the one of iron and cobalt that is included in the first ferromagnetic oxide layer and one element of a first element group, and has an easy magnetization axis extending in a direction across an interface with the metal layer. The second ferromagnetic oxide layer includes an oxide of an alloy of the one of iron and cobalt that is included in the second ferromagnetic oxide layer with a first element. The first element has a standard electrode potential lower than a standard electrode potential of iron or cobalt and a standard electrode potential of the one element of the first element group included in the second ferromagnetic layer.

Embodiments will now be described with reference to the figures.

In the following description, components with substantially the same functionalities and configurations will be referred to with the same reference numerals, and repeated descriptions may be omitted.

The figures are schematic, and the relation between the thickness and the area of a plane of a layer and the ratio of thicknesses of layers may differ from those in actuality. The figures may include components which differ in relations and/or ratios of dimensions in different figures. The entire description of a particular embodiment also applies to another embodiment unless explicitly mentioned otherwise or obviously eliminated. Each embodiment illustrates a device and a method for materializing the technical idea of that embodiment, and the technical idea of each embodiment does not limit the quality of the material, shape, structure, arrangement of components, etc. to those that will be described below.

In the specification and the accompanying claims, a phrase of a particular first component being "coupled" to another second component includes the first component being coupled to the second component either directly or via one or more components which are always or selectively conductive.

The embodiments will be described using an xyz orthogonal coordinate system. In the description below, the term "below" as well as the terms derived therefrom and related thereto refer to a position having a smaller coordinate on the z-axis, and "above" as well as the terms derived therefrom and the terms related thereto refer to a position having a larger coordinate on the z-axis.

1. First Embodiment

1.1. Structure (Configuration)

1.1.1. Overall Structure

Figure 1:
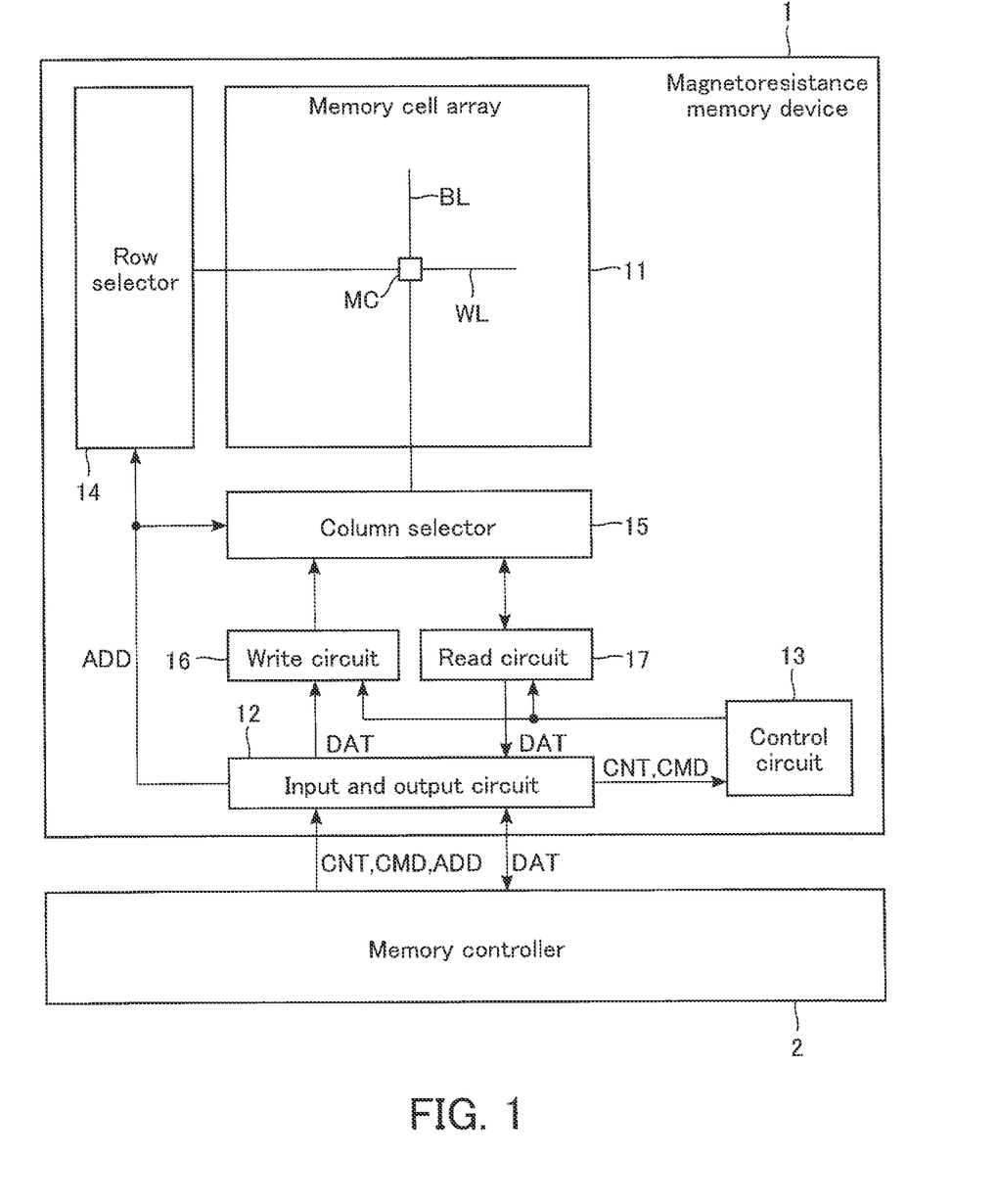
FIG. 1 shows functional blocks and relevant components of a magnetoresistance memory device of a first embodiment.

FIG. 1 shows functional blocks of a memory device according to a first embodiment. As shown in FIG. 1, the magnetoresistance memory device 1 is controlled by a memory controller 2. The magnetoresistance memory device 1 is a memory device which stores data using ferromagnets. The magnetoresistance memory device 1 includes a memory cell array 11, an input and output circuit 12, a control circuit 13, a row selector 14, a column selector 15, a write circuit 16, and a read circuit 17.

The memory cell array 11 is a set of arranged memory cells MC. The memory cells MC can store data in a non-volatile manner. In the memory cell array 11, word lines WL and bit lines BL are located. Each memory cell MC is coupled to a single word line WL and a single bit line BL. Each word line WL is associated with a row. Each bit line BL is associated with a column. Selection of a single row and selection of a single column specify a single memory cell MC.

The input and output circuit 12 is a circuit which performs input and output of data and signals. The input and output circuit 12 receives a control signal CNT, a command CMD, an address signal ADD, and data (write data) DAT from a memory controller 2. The input and output circuit 12 transmits data (read data) DAT to the memory controller 2.

The row selector 14 receives the address signal ADD from the input and output circuit 12, and brings a single word line WL associated with the row specified by the received address signal ADD into a selected state.

The column selector 15 receives the address signal ADD from the input and output circuit 12, and brings one or more bit lines BL associated with the column specified by the received address signal ADD into a selected state.

The control circuit 13 receives the control signal CNT and the command CMD from the input and output circuit 12. The control circuit 13 controls the write circuit 16 and the read circuit 17 based on a control instructed by the control signal CNT and the command CMD. Specifically, the control circuit 13 supplies voltages used for data writing to the write circuit 16 during the data writing to the memory cell array 11. Further, the control circuit 13 supplies voltages used for data reading to the read circuit 17 during the reading of data from the memory cell array 11.

The write circuit 16 receives write data DAT from the input and output circuit 12 and supplies the voltages for data writing to the column selector 15 based on the control by the control circuit 13 and the write data DAT.

The read circuit 17 uses the voltages used for data reading based on the control of the control circuit 13, to determine data stored in the memory cells MC. The determined data is supplied to the input and output circuit 12 as the read data DAT. The read circuit 17 includes a sense amplifier.

1.1.2. Circuit Configuration of Memory Cell Array

Figure 2:
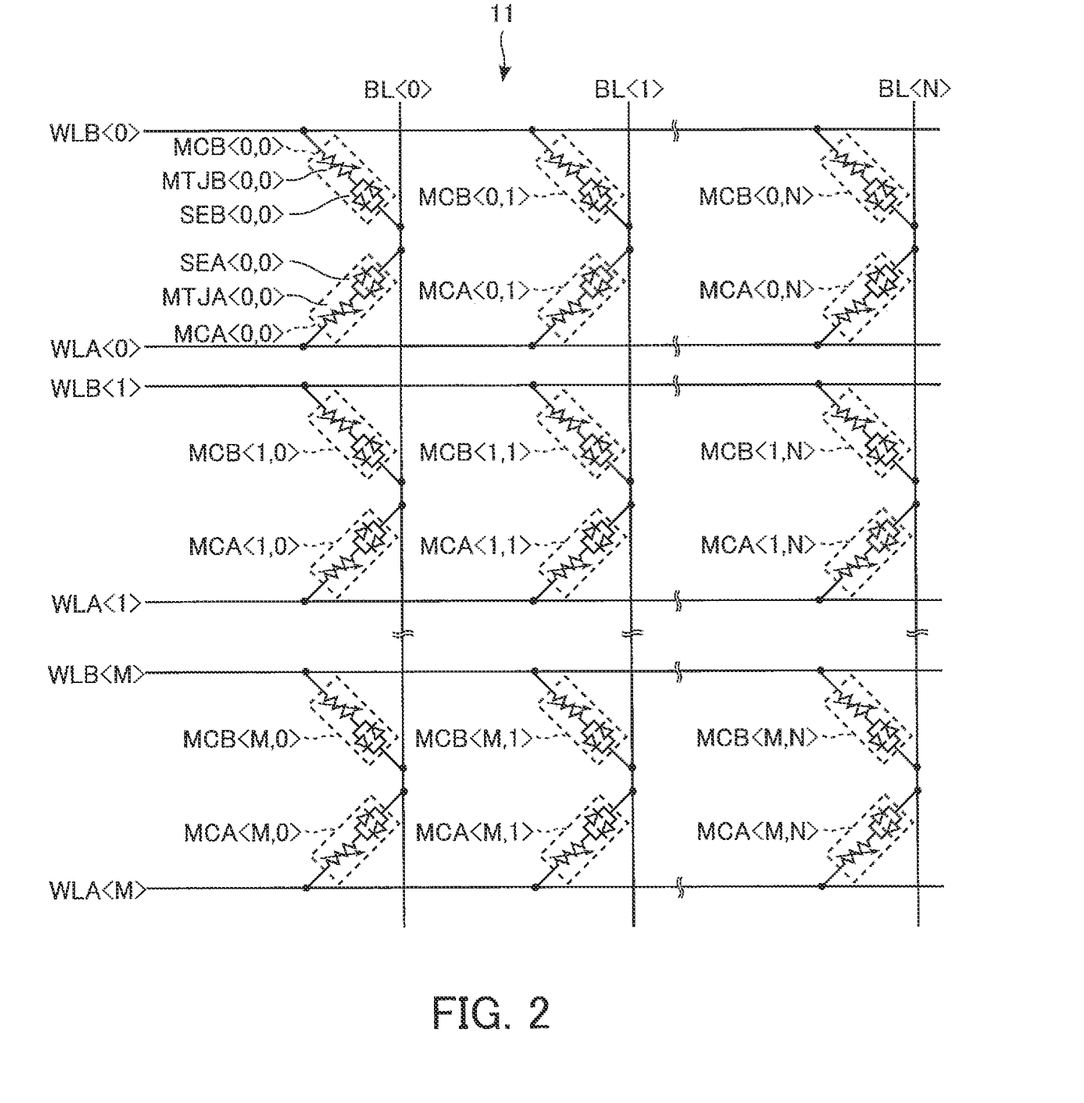
FIG. 2 is a circuit diagram of a memory cell array of the first embodiment.

FIG. 2 is a circuit diagram of a memory cell array 11 according to the first embodiment. As shown in FIG. 2, M+1 (M being a natural number) word lines WLA (WLA<0>, WLA<1>, ..., WLA<M>) and M+1 word lines WLB (WLB<0>, WLB<1>, ..., WLB<M>) are provided in the memory cell array 11. N+1 (N being a natural number) bit lines BL (BL<0>, BL<1>, ..., BL<N>) are also provided in the memory cell array 11.

Each of the memory cells MC (MCA and MCB) includes two nodes. Each memory cell MC is coupled, at its first end, to a single word line WL, and is coupled, at its second node, to a single bit line BL. More specifically, the memory cells MCA encompass memory cells MCA<$\alpha$, $\beta$> for all combinations of $\alpha$ and $\beta$, where $\alpha$ is every integer equal to or greater than 0 and equal to or less than M, and $\beta$ is every integer equal to or greater than 0 and equal to or less than N, and the memory cell MCA<$\alpha$, $\beta$> is coupled between the word line WLa<$\alpha$> and the bit line BL<$\beta$>. Similarly, the memory cells MCB encompass memory cells MCB<$\alpha$, $\beta$>, for all combinations of $\alpha$ and $\beta$, where a is every integer equal to or greater than 0 and equal to or less than M, and $\beta$ is every integer equal to or greater than 0 and equal to or less than N, and the memory cell MCB<$\alpha$, $\beta$> is coupled between the word line WLb<$\alpha$> and the bit line BL<$\beta$>.

Each memory cell MC includes a single MTJ element MTJ (MTJA or MTJB) and a single switching element SE (SEA or SEB). More specifically, the memory cell MCA<$\alpha$, $\beta$> includes an MTJ element MTJA<$\alpha$, $\beta$> and a switching element SEA<$\alpha$, $\beta$> for all combinations of $\alpha$ and $\beta$, where $\alpha$ is every integer equal to or greater than 0 and equal to or less than M, and $\beta$ is every integer equal to or greater than 0 and equal to or less than N. Furthermore, each memory cell MCB<$\alpha$, $\beta$> includes an MTJ element MTJB<$\alpha$, $\beta$> and a switching element SEB<$\alpha$, $\beta$> for all combinations of $\alpha$ and $\beta$, where $\alpha$ is every integer equal to or greater than 0 and equal to or less than M, and $\beta$ is every integer equal to or greater than 0 and equal to or less than N.

In each memory cell MC, the MTJ element MTJ and the switching element SE are coupled in series. The MTJ element MTJ is coupled to a single word line WL, and the switching element SE is coupled to a single bit line BL.

The MTJ element MTJ exhibits the tunnel magnetoresistance effect, and is, for example, an element that includes a magnetic tunnel junction (MTJ). The MTJ element MTJ can switch between a low-resistance state and a high-resistance state. The MTJ element MTJ can store 1-bit data, using the difference in the two resistance states.

The switching element SE is an element for selecting the memory cell MC in which this switching element SE is included. The switching element SE can be a switching element described below, for example. The switching element includes two terminals, and, when a voltage smaller than a first threshold is applied in a first direction between the two terminals, the switching element is in a high-resistance state, i.e., electrically non-conductive (in an OFF state). In contrast, when a voltage equal to or greater than a first threshold is applied in the first direction between the two terminals, the switching element is in a low-resistance state, i.e., electrically conductive (in an ON state). The switching element is further equipped with a function similar to the that of switching between the high-resistance state and the low-resistance state based on the magnitude of the voltage applied in the first direction, with respect to a second direction opposite to the first direction. In other words, the switching element is a bidirectional switching element. By turning the switching element on or off, it is possible to perform control as to whether or not to supply a current to an MTJ element MTJ coupled to the switching element, namely, whether or not to select the MTJ element MTJ.

1.1.3. Structure of Memory Cell Array

Figure 3:
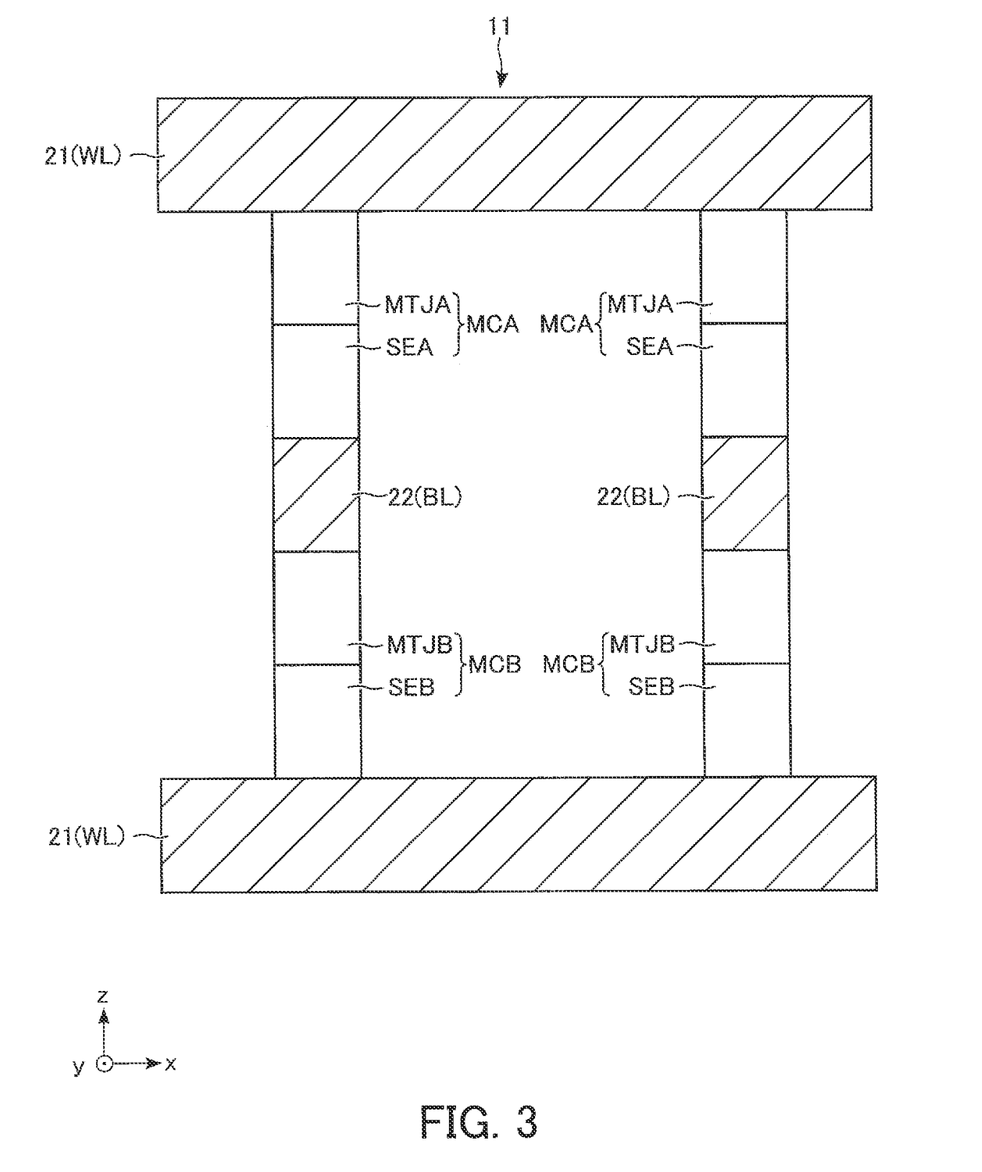
FIG. 3 shows a cross-sectional structure of part of the memory cell array of the first embodiment.
Figure 4:
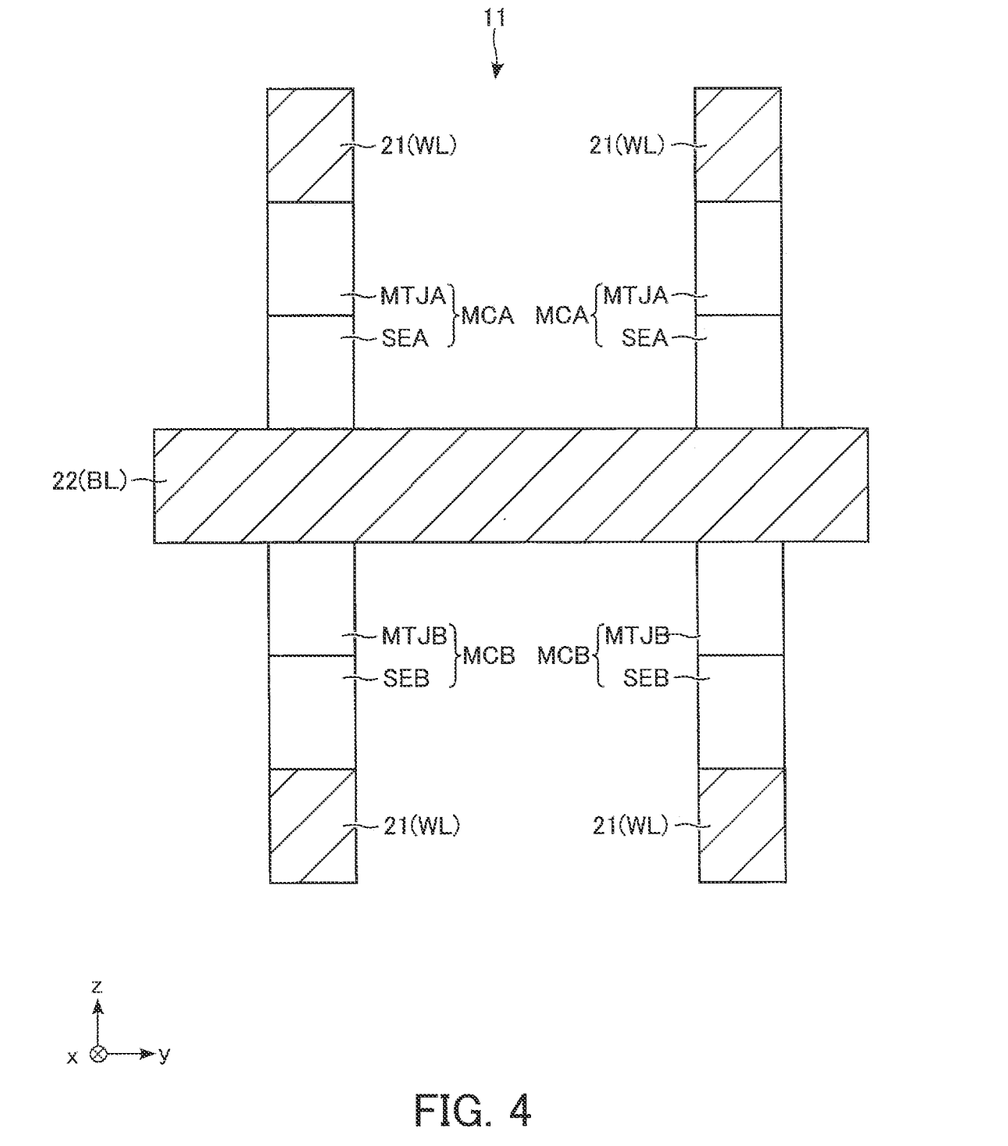
FIG. 4 shows a cross-sectional structure of part of the memory cell array of the first embodiment.

FIGS. 3 and 4 show a cross-sectional structure of part of the memory cell array 11 of the first embodiment. FIG. 3 shows the cross-section along the xz-plane, and FIG. 4 shows the cross-section along the yz-plane.

As shown in FIGS. 3 and 4, conductors 21 are provided above the semiconductor substrate (not shown). The conductors 21 extend along the y-axis and are aligned along the x-axis. Each conductor 21 functions as a word line WL.

Each conductor 21 is coupled, at its upper surface, to the lower surfaces of memory cells MCB. Each memory cell MCB has, for example, a circular shape in the xy-plane. The memory cells MCB are aligned along the y-axis on each conductor 21, and this arrangement provides a matrix of memory cells MCB over the xy-plane. Each memory cell MCB includes a structure that functions as a switching element SEB and a structure that functions as an MTJ element MTJB. The structure that functions as a switching element SEB and the structure that functions as an MTJ element MTJB each have one or more layers, as will be described later.

Conductors 22 are provided above the memory cells MCB. The conductors 22 extend along the x-axis and are aligned along the y-axis. Each conductor 22 is in contact with, at its lower surface, to the upper surfaces of memory cells MCB aligned along the x-axis. Each conductor 22 functions as a bit line BL.

Each conductor 22 is coupled, at its upper surface, to the lower surfaces of memory cells MCA. Each memory cell MCA has, for example, a circular shape in the xy-plane. The memory cells MCA are aligned along the x-axis on each conductor 22, and this arrangement provides a matrix of memory cells MCA over the xy-plane. Each memory cell MCA includes a structure that functions as a switching element SEA and a structure that functions as an MTJ element MTJA. The structure that functions as a switching element SEA and the structure that functions as an MTJ element MTJA each have one or more layers, as will be described later.

A further conductor 21 is provided on the top surfaces of memory cells MCA aligned along the y-axis.

1.1.4. Structure of Memory Cell

Figure 5:
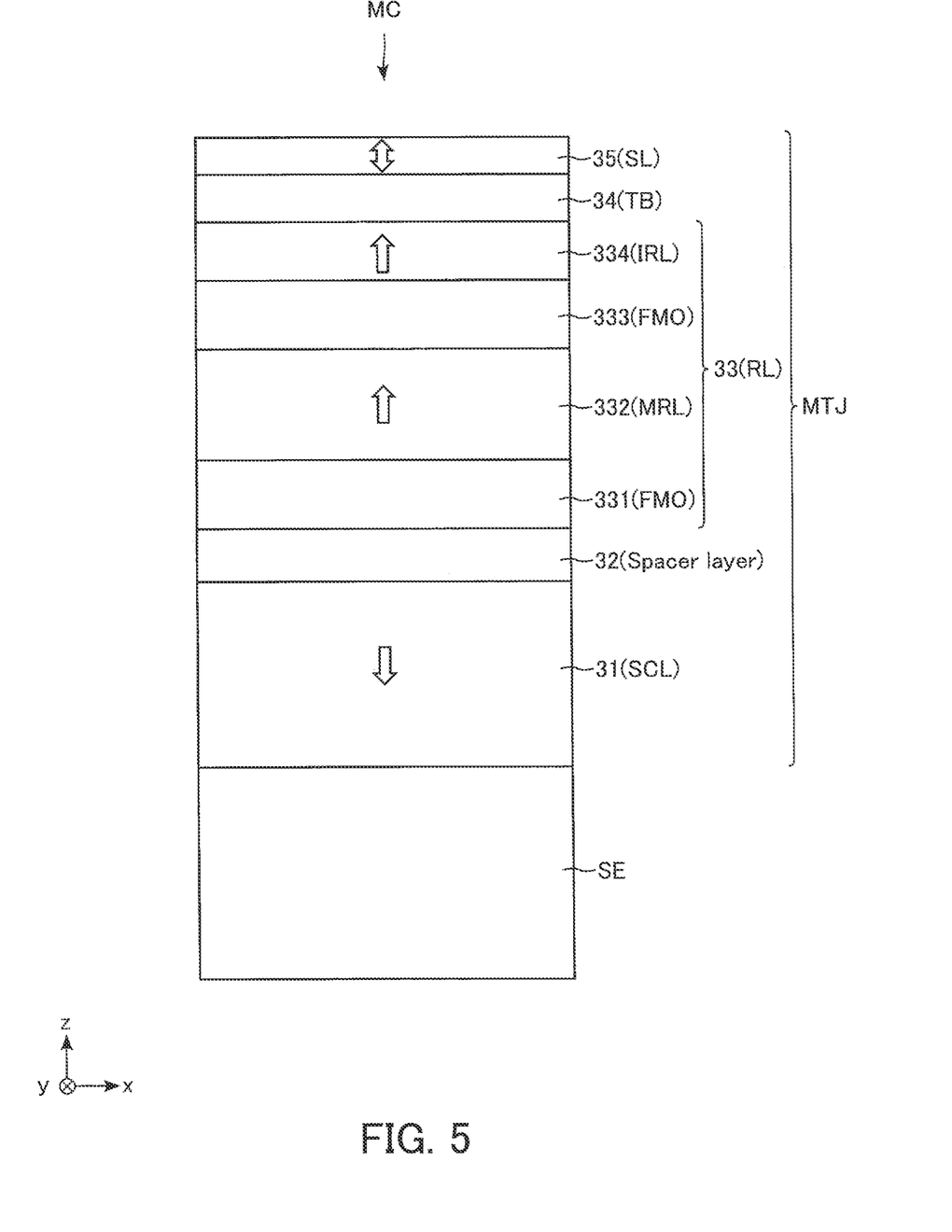
FIG. 5 shows a cross section of an example of the structure of a memory cell of the first embodiment.

FIG. 5 shows a cross section of an example of the structure of a memory cell MC according to the first embodiment. As shown in FIG. 5, the memory cell MC includes a switching element SE and an MTJ element MTJ.

The switching element SE includes a variable resistance material. The switching element SE may further include a lower electrode and an upper electrode. In this case, the variable resistance material is located on the top surface of the lower electrode, and the upper electrode is located on the top surface of the variable resistance material.

The variable resistance material is, for example, a switching element between two terminals, the first of the two terminals being one of the upper and lower surfaces of the variable resistance material, the second of the two terminals being the other one of the upper and lower surfaces of the variable resistance material. When a voltage applied between the two terminals is less than a threshold, the switching element is in a "high-resistance" state, e.g., in an electrically non-conductive state. When a voltage applied between the two terminals is equal to or greater than the threshold, the switching element is in a "low-resistance" state, e.g., in an electrically conductive state. The variable resistance material is formed of a material made of insulators, and contains a dopant introduced by ion implantation. The insulator includes, for example, an oxide, and includes $SiO_2$ or a material that is substantially formed of $SiO_2$. The dopant contains, for example, arsenic (As) and germanium (Ge). In the specification and the accompanying claims, the expression "substantially formed (or, made)" including the term "substantially" and similar expressions mean that a component that is "substantially formed" of something is allowed to contain unintended impurities. Examples of the unintended impurities include atoms of elements contained in a gas used during the manufacturing process of the magnetoresistance memory device 1, and atoms of elements that have diffused from the surroundings of other components that are "substantially formed" of something to the component that is "substantially formed" of something.

The MTJ element MTJ includes a ferromagnetic layer 31, a spacer layer 32, a ferromagnetic layer 33, an insulating layer 34, and a ferromagnetic layer 35. The ferromagnetic layer 31, the spacer layer 32, the ferromagnetic layer 33, the insulating layer 34, and the ferromagnetic layer 35 are stacked in this order on an upper surface of the switching element SE.

The ferromagnetic layer 31, the ferromagnetic layer 33, and the ferromagnetic layer 35 have easy magnetization axes extending along a direction passing through the interfaces of the ferromagnetic layer 31, the spacer layer 32, the ferromagnetic layer 33, the insulating layer 34, and the ferromagnetic layer 35. The easy magnetization axes of the ferromagnetic layer 31, the ferromagnetic layer 33, and the ferromagnetic layer 35 have an angle that is, for example, equal to or greater than 45 degrees and equal to or smaller than 90 degrees with respect to the interfaces, or, for example, perpendicular to the interfaces. The arrows inside the components shown in FIG. 5 represent directions of magnetization.

The ferromagnetic layer 31, the spacer layer 32, the ferromagnetic layer 33, the insulating layer 34, and the ferromagnetic layer 35 are further described.

The ferromagnetic layer 31 is a layer of ferromagnet. The ferromagnetic layer 31 includes or is substantially formed of an element exhibiting a ferromagnetic property. The ferromagnetic layer 31 includes or is substantially formed of, for example, cobalt platinum (CoPt), cobalt nickel (CoNi), or cobalt palladium (CoPd). The ferromagnetic layer 31 includes, for example, a structure in which a cobalt (Co) layer and a platinum (Pt) layer are alternated one or more times, a structure in which a Co layer and a nickel (Ni) layer are alternated one or more times, or a structure in which a Co layer and a palladium (Pd) layer are alternated one or more times.

The ferromagnetic layer 31 has a magnetization direction opposite to the magnetization direction of the ferromagnetic layer 33. The ferromagnetic layer 31 suppresses a magnetic field generated by the ferromagnetic layer 33 and applied to the ferromagnetic layer 35, or a stray field. The ferromagnetic layer 31 functions as a so-called shift cancel layer (SCL).

The spacer layer 32 is a non-magnetic metal layer that antiferromagnetically couples two ferromagnets sandwiching the spacer layer 32. The spacer layer 32 includes or is substantially formed of ruthenium (Ru) or iridium (Ir). Each of Ru and Ir causes the two ferromagnets sandwiching the layer of Ru or Ir to be coupled ferromagnetically or antiferromagnetically, depending on the thickness of Ru or Ir. The spacer layer 32 has a thickness that causes antiferromagnetic coupling between the ferromagnetic layer 31 and the ferromagnetic layer 33 (in particular, a ferromagnetic layer 332 described later included in the ferromagnetic layer 33).

The ferromagnetic layer 33 as a whole is a layer stack having a magnetization along a direction passing through the interfaces of the ferromagnetic layer 33, the insulating layer 34, and the ferromagnetic layer 35. The direction of magnetization of the ferromagnetic layer 33 is intended so as not to be varied by reading data from or writing data to the memory cells MC. The ferromagnetic layer 33 functions as a so-called reference layer (RL).

The ferromagnetic layer 33 includes a ferromagnetic oxide layer (FMO) 331, a ferromagnetic layer 332, a ferromagnetic oxide layer (FMO) 333, and a ferromagnetic layer 334.

The ferromagnetic oxide layer 331 is a layer of an alloy oxide exhibiting a ferromagnetic property. The alloy oxide includes or is substantially formed of an oxide of an alloy of iron (Fe) and/or Co with one or more of boron (B), scandium (Sc), chromium (Cr), manganese (Mn), Ni, Ru, Pd, Ir, Pt, yttrium (Y), neodymium (Nd), samarium (Sm), gadolinium (Gd), terbium (Tb), and dysprosium (Dy).

The ferromagnetic oxide layer 331 increases interface magnetic anisotropy of the ferromagnetic layer 33. The ferromagnetic layer 332 is formed in an amorphous state and thereafter becomes crystalline via annealing. The ferromagnetic layer 332 formed in an amorphous state contains impurities. The impurities in the ferromagnetic layer 332 diffuse into the ferromagnetic oxide layer 331 by the annealing. The diffusion increases the purity of the ferromagnetic layer 332, and crystallization progresses in a high-purity state. Therefore, the crystallized ferromagnetic layer 332 has a high crystallinity. The ferromagnetic layer 332 having a high crystallinity leads to the ferromagnetic layer 33 as a whole having a high interface magnetic anisotropy. The interface magnetic anisotropy of the ferromagnetic layer 33 expressed by using the ferromagnetic oxide layer 331 is higher than the interface magnetic anisotropy of a ferromagnetic layer provided with a metal layer instead of the ferromagnetic oxide layer 331 in the structure of the ferromagnetic layer 33.

The interface magnetic anisotropy of a magnetic body correlates with anisotropic energy of the magnetic body. Therefore, the high interface magnetic anisotropy of the ferromagnetic layer 33 leads to a high anisotropic energy of the ferromagnetic layer 33. The high anisotropic energy of the ferromagnetic layer 33 leads to a high retention property of the MTJ element MTJ. The retention property refers to difficulty of switching of the resistance state of the MTJ element due to thermal disturbance from outside of the MTJ element. Although the magnetization of the ferromagnetic layer 33 is intended not to switch, it may be unintentionally switched by an external influence. If the magnetization of the ferromagnetic layer 33 is switched, the MTJ element MTJ cannot store data correctly.

The ferromagnetic layer 332 is a layer of ferromagnet. The ferromagnetic layer 332 is antiferromagnetically coupled with the ferromagnetic layer 31 via the spacer layer 32, and has magnetization due to the antiferromagnetic coupling. The direction of the magnetization of the overall ferromagnetic layer 33 conforms to the direction of magnetization of the ferromagnetic layer 332. The magnetization of the ferromagnetic layer 332 functions as a supply source of anisotropic energy that generates magnetization expressed by the overall ferromagnetic layer 33. The ferromagnetic layer 332 is a main supply source of the anisotropic energy that generates magnetization expressed by the overall ferromagnetic layer 33. Based on this function, the ferromagnetic layer 332 may be referred to as a main reference layer (MRL)

The ferromagnetic layer 332 has a high wettability to the ferromagnetic oxide layer 331. For this purpose, the ferromagnetic layer 332 and the ferromagnetic oxide layer 331 include a common element. More specifically, the ferromagnetic layer 332 includes one or both of Fe and Co, which are the elements included in the ferromagnetic oxide layer 331. The ferromagnetic layer 332 further includes a material and structure to express anisotropic energy. Specifically, the ferromagnetic layer 332 further includes one or more of boron (B), chromium (Cr), manganese (Mn), Ni, Ru, rhodium (Rh), Pd, Ir, and Pt. The ferromagnetic layer 332 may have a structure in which two or more of Fe, Co, B, Cr, Mn, Ni, Ru, Rh, Pd, Ir, and Pt layers are stacked.

The ferromagnetic oxide layer 333 is an alloy oxide layer exhibiting a ferromagnetic property. The ferromagnetic oxide layer 333 has a high wettability to the ferromagnetic layer 332. For this purpose, the ferromagnetic oxide layer 333 and the ferromagnetic layer 332 include a common element. More specifically, the ferromagnetic layer 333 includes one or both of Fe and Co, which are the elements included in the ferromagnetic oxide layer 332.

The ferromagnetic oxide layer 333 is a layer of an oxide of an alloy of an element having a standard electrode potential lower than that of one, more or all of the elements included in the ferromagnetic layer 332.

Based on the conditions for the alloy oxide of the ferromagnetic oxide layer 333, the alloy oxide includes or is substantially formed of an oxide of an alloy of one or both of Fe and Co with one or more of B, Sc, Y, Nd, Sm, Gd, Tb, and Dy.

The ferromagnetic oxide layer 333 increases the interface magnetic anisotropy of the ferromagnetic layer 33 by the same mechanism as that by the ferromagnetic oxide layer 331. Specifically, impurities in the ferromagnetic layer 332 formed in an amorphous state diffuse into the ferromagnetic oxide layer 333 by annealing the ferromagnetic layer 332. The diffusion increases the purity of the ferromagnetic layer 332, and the crystallized ferromagnetic layer 332 has a high crystallinity. This leads to the ferromagnetic layer 33 as a whole having a high interface magnetic anisotropy. The interface magnetic anisotropy of the ferromagnetic layer 33 expressed by using the ferromagnetic oxide layer 333 is higher than the interface magnetic anisotropy of a ferromagnetic layer having a structure provided with a metal layer instead of the ferromagnetic oxide layer 333 in the structure of the ferromagnetic layer 33. Thus, the retention property of the MTJ element MTJ is also increased by the ferromagnetic oxide layer 333.

The ferromagnetic oxide layer 333 is provided between the ferromagnetic layer 332 and the ferromagnetic layer 334 to suppress the crystal structure of the ferromagnetic layer 332 influencing the crystal structure of the ferromagnetic layer 334. Specifically, the ferromagnetic layer 334 is first formed in an amorphous state, and subsequently crystallized via annealing to form a crystal structure. The crystallization progresses using the insulating layer 34 as a seed. During this, if the ferromagnetic layer 334 in the amorphous state is in contact with the ferromagnetic layer 332, the crystal structure of the ferromagnetic layer 334 is influenced by the crystal structure of the ferromagnetic layer 332. The presence of the ferromagnetic oxide layer 333 suppresses the influence of the crystal structure of the ferromagnetic layer 332 on the crystal structure of the ferromagnetic layer 334.

The ferromagnetic layer 334 is a layer of ferromagnet. The ferromagnetic layer 334 includes one or more of iron (Fe) and cobalt (Co). The ferromagnetic layer 334 may further include boron (B). More specifically, for example, the ferromagnetic layer 334 includes or is substantially formed of cobalt iron boron (CoFeB) or iron boron (FeB).

Based on the suppression of the influence of the crystal structure of the ferromagnetic layer 332 on the crystal structure of the ferromagnetic layer 334 and the crystallization of the ferromagnetic layer 334 using the insulating layer 34 as a seed, the ferromagnetic layer 334 has the same crystal structure as that of the insulating layer 34.

The ferromagnetic layer 334 increases the interface magnetic anisotropy of the ferromagnetic layer 33 by the same mechanism as that for increasing the crystallinity of the ferromagnetic oxide layer 332. Specifically, the ferromagnetic layer 334 is formed in an amorphous state as described above, and thereafter becomes crystalline via annealing. Impurities in the ferromagnetic layer 334 diffuse into the ferromagnetic oxide layer 333 by the annealing. The diffusion causes the ferromagnetic layer 334 to have a high crystallinity, which leads to the ferromagnetic layer 33 as a whole having a high interface magnetic anisotropy. Thus, the retention property of the MTJ element MTJ is also increased by the high crystallinity of the ferromagnetic layer 334.

Generally, a ferromagnet magnetically couples two ferromagnets sandwiching this ferromagnet. Since the ferromagnetic oxide layer 333 has a ferromagnetic property, it magnetically couples the ferromagnetic layer 332 and the ferromagnetic layer 334, which sandwich the ferromagnetic oxide layer 333. The direction of magnetization of the ferromagnetic layer 334 due to the ferromagnetic coupling with the magnetization of the ferromagnetic layer 332 is the same as the direction of magnetization of the ferromagnetic layer 332. Since the ferromagnetic layer 334 and the ferromagnetic layer 332 are ferromagnetically coupled, the ferromagnetic layer 334 and the ferromagnetic layer 332 behave as a single ferromagnetic layer that effectively has a high magnetic anisotropy energy. Due to the high effective magnetic anisotropy energy of the ferromagnetic layer 33 using the ferromagnetically coupled ferromagnetic layer 334 and the ferromagnetic layer 332, the MTJ element MTJ has a high retention property.

1.2. Advantages (Advantageous Effects)

The first embodiment can provide an MTJ element MTJ having a high magnetic property, as will be described below.

According to the first embodiment, the ferromagnetic oxide layer 333 includes or is substantially made of an oxide of an alloy of one or both of Fe and Co with an element having a standard electrode potential lower than that of the elements included in the ferromagnetic layer 332. In other words, the ferromagnetic oxide layer 333 is substantially formed of an element having a standard electrode potential lower than that of the elements substantially constituting the ferromagnetic layer 334 and the ferromagnetic layer 332 with which the ferromagnetic oxide layer 333 is in contact. This means that the ferromagnetic oxide layer 333 is oxidized more easily than the ferromagnetic layers 332 and 334. Thus, the ferromagnetic oxide layer 333 confines oxygen atoms inside itself with a force higher than the force at which the oxygen atoms diffuse into the ferromagnetic layer 332 and/or 334. Therefore, the oxygen atoms are suppressed from diffusing into the ferromagnetic layers 332 and 334. In the ferromagnetic layers 332 and 334, the oxygen atoms are impurities. Therefore, the suppression of the diffusion of the oxygen atoms into the ferromagnetic layers 332 and 335 suppresses deterioration of the magnetic properties of the ferromagnetic layers 332 and 334 due to the oxygen atoms in the ferromagnetic layers 332 and 334. Thus, deterioration of the interface magnetic anisotropy of the ferromagnetic layer 33 and deterioration of the MR ratio of the MTJ element MTJ are suppressed. This is because the MR ratio of the MTJ element MTJ depends on the properties of the ferromagnetic layers 35 and 334, which are in contact with the insulating layer 34, and the presence of the oxygen atoms as the impurities leads to deterioration of the magnetic property of the ferromagnetic layer 334 and, in turn, to deterioration of the MR ratio. The MR ratio is a ratio of a resistance in a low resistance state and a resistance in a high resistance state of the magnetoresistance effect element (MTJ).

According to the first embodiment, the ferromagnetic oxide layer 331 and the ferromagnetic layer 332 include a common atom, and the ferromagnetic layer 332 and the ferromagnetic oxide layer 333 include a common atom. The adhesiveness (wettability) of the interface of different materials influences the properties of the materials. This is because a low adhesiveness may cause a hole and/or an aggregation of atoms. The adhesiveness of the interface of different materials can be increased by inclusion of a common element in the two materials forming the interface. Therefore, the ferromagnetic oxide layer 331 and the ferromagnetic layer 332 have a high wettability at their interface due to including a common element, and the ferromagnetic layer 332 and the ferromagnetic oxide layer 333 have a high wettability at their interface due to including a common element. Accordingly, the ferromagnetic oxide layer 331, the ferromagnetic layer 332, and the ferromagnetic oxide layer 333 having superior characteristics are provided, which contributes to attainment of an MTJ element MTJ having a high magnetic property.

According to the first embodiment, the ferromagnetic oxide layer 331 is provided between the spacer layer 32 and the ferromagnetic layer 332. If first and second materials different from each other are in contact, an element in one material can diffuse into the other at the interface between the two materials. Since the diffused material is an impurity in the first or second material, it may deteriorate the properties of the first or second material. To suppress the diffusion of the impurity into the first or second material, a third material may be provided between the first and second materials. Accordingly, mutual diffusion of the elements between the first and second materials can be suppressed, and the amount of impurities in the first material and the amount of impurities in the second material can be suppressed as compared to the case where the first and second materials are in contact. As a structure of the MTJ element for reference, a metal layer may be provided between the spacer layer 32 and the ferromagnetic layer 332. However, the retention property of such an MTJ element is not as high as desired.

According to the first embodiment, since the ferromagnetic oxide layer 331 is an oxide, it is more chemically stable as compared to a single metal element in many cases and does not easily react with an ambient element. Specifically, the ferromagnetic oxide layer 331 does not easily react with an element in the spacer layer 32, which is in contact with the ferromagnetic oxide layer 331, or an element in the ferromagnetic layer 332, which is in contact with the ferromagnetic oxide layer 331. For the same reason, an element in the ferromagnetic oxide layer 331 dose not easily diffuse into the spacer layer 32 and the ferromagnetic layer 332. Thus, diffusion of an impurity into the spacer layer 32 and the ferromagnetic layer 332 is suppressed, so that deterioration of the properties of the spacer layer 32 and the ferromagnetic layer 332 due to the diffusion of the impurities is suppressed. The suppression of the deterioration of the properties (in particular, the magnetic property) of the ferromagnetic layer 332 helps the ferromagnetic layer 332 to have a high magnetic anisotropy energy. The suppression of the deterioration of the properties of the spacer layer 32 serves to suppress the reduction of the strength of the antiferromagnetic coupling between the ferromagnetic layer 332 and the ferromagnetic layer 31, and, in turn, to suppress the deterioration of the retention property of the MTJ element MTJ. Accordingly, an MTJ element MTJ having a high magnetic property can be attained.

Figure 6:
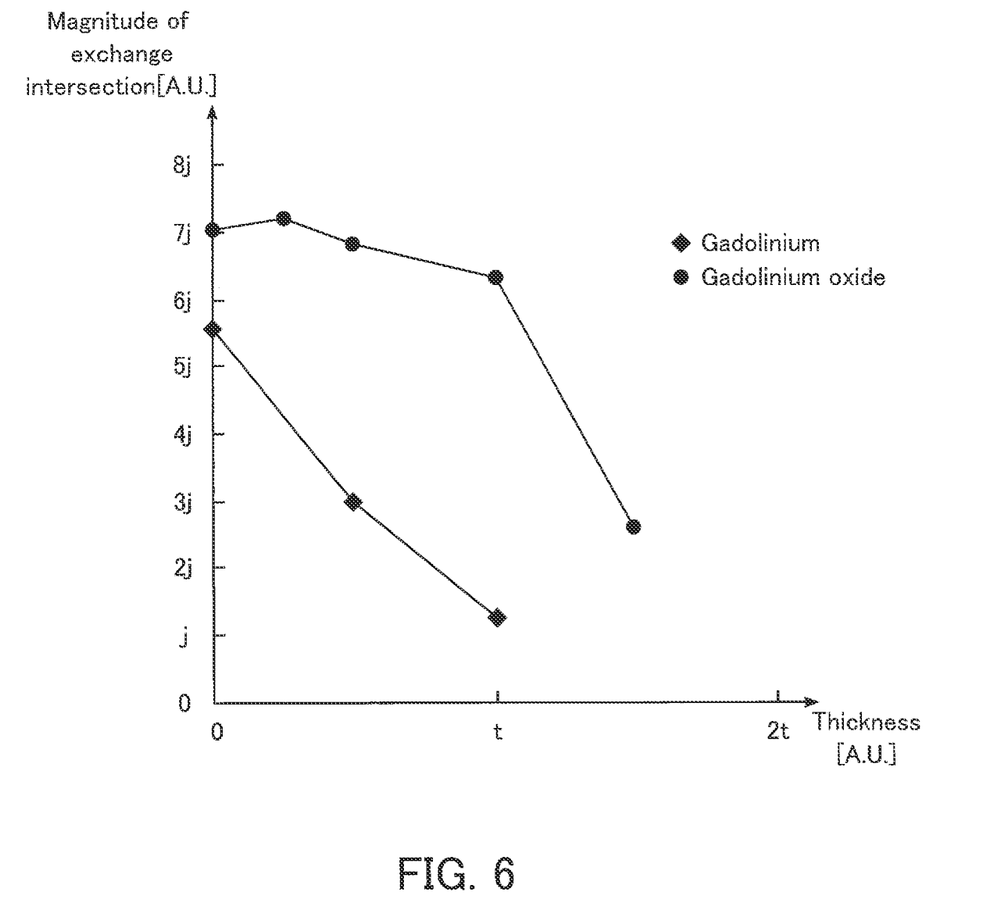
FIG. 6 shows characteristics exhibited by a layer used in the first embodiment.

FIG. 6 shows a property exhibited by the ferromagnetic oxide layer 331 of the first embodiment. More specifically, FIG. 6 shows a property of an MTJ element including the spacer layer 32 and a ferromagnetic layer 1332 that can function as a main part of a reference layer such as the ferromagnetic layer 332, in a case where a layer of a different material is formed between the spacer 32 and the ferromagnetic layer 1332. The vertical axis in FIG. 6 represents the magnitude of an exchange interaction between the two ferromagnetic layers 31 and 332 sandwiching the spacer layer 32. The magnitude of the exchange interaction correlates to the strength of coupling between the ferromagnetic layers 31 and 332, and the strength of the coupling influences a force to maintain the magnetization of the reference layer, and, in turn, influences the retention property of the MTJ element.

FIG. 6 shows a case as an example of the first embodiment, in which the ferromagnetic oxide layer 331 substantially formed of gadolinium oxide is provided between the spacer layer 32 and the ferromagnetic layer 332. FIG. 6 also shows a case as a comparative example, in which a layer substantially formed of gadolinium is provided between the spacer layer 32 and the ferromagnetic layer 1332.

As shown in FIG. 6, over the entire range of the thickness shown in FIG. 6, the magnitude of the exchange intersection in the case of using gadolinium oxide is greater than that in the case of using gadolinium. Therefore, the use of gadolinium oxide provides the MTJ element with a higher retention property than the use of gadolinium.

2. Second Embodiment

The second embodiment is different from the first embodiment in terms of layers included in the MTJ element. Hereinafter, differences from the first embodiment will be mainly described. Of the components of the second embodiment, a component different from the corresponding component of the first embodiment is distinguished from that of the first embodiment by adding a letter or a numeral to the end of the reference symbol of the component of the first embodiment. For example, an MTJ element MTJ in the second embodiment may be referred to as an MTJ element MTJb, and for matters other than those described as the second embodiment, the matters described in the first embodiment are applied.

Figure 7:
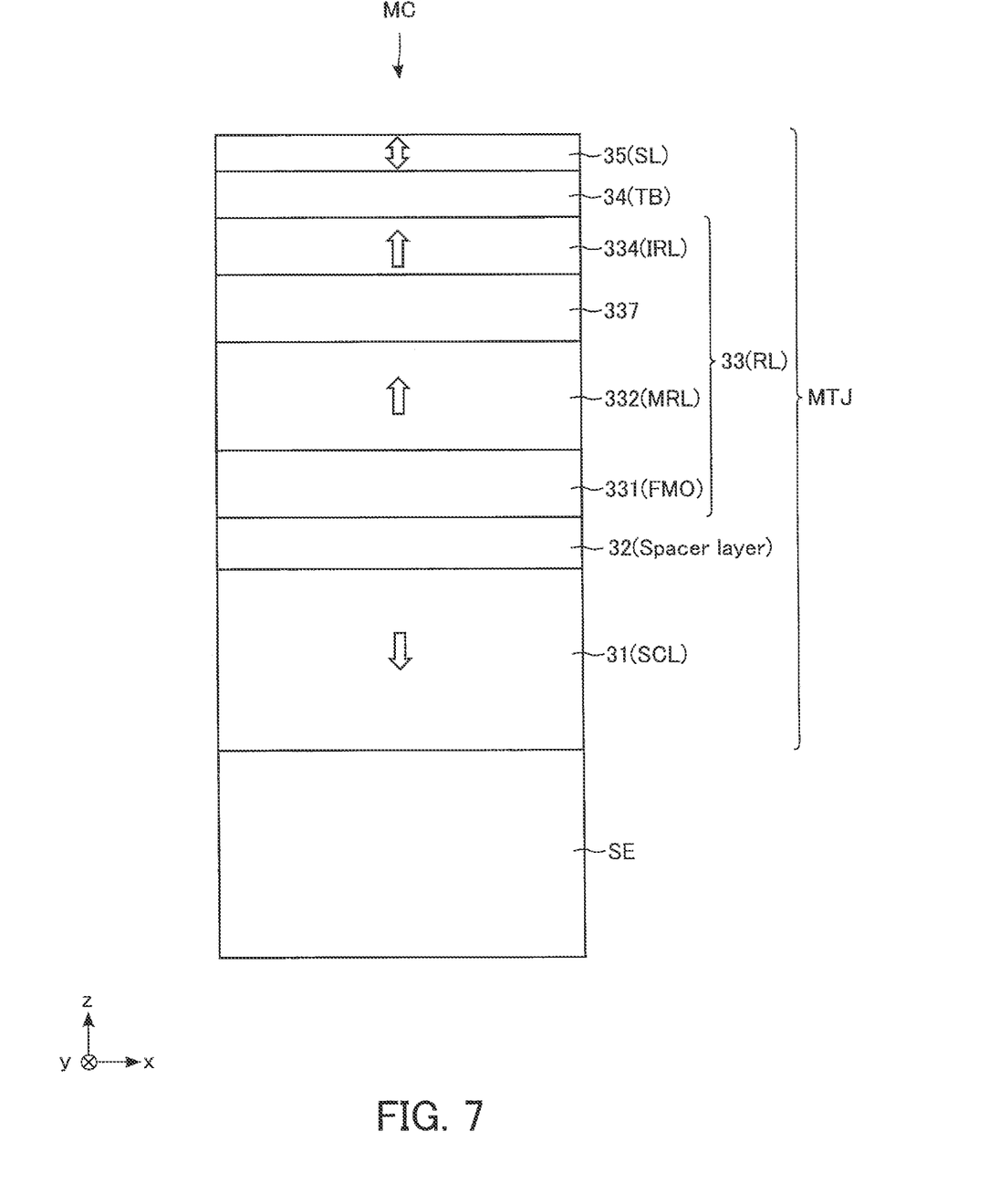
FIG. 7 shows a cross section of an example of the structure of a memory cell of a second embodiment.

FIG. 7 shows a cross section of an example of the structure of a memory cell MC according to the second embodiment. As shown in FIG. 7, the memory cell MC includes an MTJ element MTJb. The MTJ element MTJb includes a metal layer 337 instead of the ferromagnetic oxide layer 333 of the first embodiment. The metal layer 337 is a layer of a non-magnetic metal, and is substantially formed of one or more of molybdenum (Mo), tungsten (W), and tantalum (Ta).

According to the second embodiment, the advantages of the first embodiment other than those caused by the ferromagnetic oxide layer 333 can be obtained. Furthermore, according to the second embodiment, the ferromagnetic layer 332 is in contact with the metal layer 337. When a metal and a metal are in contact with each other, the interface between the metals has a high wettability. Therefore, the ferromagnetic layer 332 and the metal layer 337 do not need to have the configuration the ferromagnetic layer 332 and the ferromagnetic oxide layer 333 in contact with the ferromagnetic layer 332 to have a high wettability as in the first embodiment. Accordingly, it is possible to provide a layer of a material between the ferromagnetic layer 332 and the ferromagnetic layer 334 that can be selected without considering the adhesiveness.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetoresistive memory device comprising:
   a first ferromagnetic layer;
   a first ferromagnetic oxide layer including one of iron and cobalt;
   a first metal layer between the first ferromagnetic layer and the first ferromagnetic oxide layer, wherein the first metal layer antiferromagnetically couples the first ferromagnetic layer and the first ferromagnetic oxide layer, and has a surface in contact with the first ferromagnetic layer;
   a second ferromagnetic layer on a surface of the first ferromagnetic oxide layer that is opposite to the first metal layer, the second ferromagnetic layer including the one of iron and cobalt that is included in the first ferromagnetic oxide layer, and having an easy magnetization axis extending in a direction across an interface with the first metal layer;
   a second metal layer provided on a surface of the second ferromagnetic layer that is opposite to the first ferromagnetic layer;
   a third ferromagnetic layer on the second metal layer;
   an insulating layer on the third ferromagnetic layer; and
   a fourth ferromagnetic layer on the insulating layer.

2. The device according to claim 1, wherein the second metal layer includes one or more of molybdenum, tungsten, and tantalum.

3. The device according to claim 2, wherein the first metal layer includes ruthenium or iridium.

4. The device according to claim 3, wherein the first ferromagnetic oxide layer includes an oxide of an alloy of iron or cobalt with one or more of boron, scandium, chromium, manganese, nickel, ruthenium, palladium, iridium, platinum, yttrium, neodymium, samarium, gadolinium, terbium, and dysprosium.

* * * * *